(12) United States Patent
DeMuth et al.

(10) Patent No.: US 12,070,902 B2
(45) Date of Patent: Aug. 27, 2024

(54) VARIABLE PRINT CHAMBER WALLS FOR POWDER BED FUSION ADDITIVE MANUFACTURING

(71) Applicant: Seurat Technologies, Inc., Mountain View, CA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene M. Berdichevsky, Oakland, CA (US)

(73) Assignee: Seurat Technologies, Inc., Wilmington, MA (US)

( * ) Notice: Subject to any disclaimer, the term of this patent is extended or adjusted under 35 U.S.C. 154(b) by 219 days.

(21) Appl. No.: 17/357,349

(22) Filed: Jun. 24, 2021

(65) Prior Publication Data
US 2021/0316409 A1     Oct. 14, 2021

Related U.S. Application Data

(63) Continuation of application No. 15/336,690, filed on Oct. 27, 2016, now Pat. No. 11,072,114.
(Continued)

(51) Int. Cl.
*B29C 67/00* (2017.01)
*B22F 3/24* (2006.01)
(Continued)

(52) U.S. Cl.
CPC ............. *B29C 64/264* (2017.08); *B22F 3/24* (2013.01); *B22F 10/00* (2021.01); *B22F 10/28* (2021.01); *B22F 10/34* (2021.01); *B22F 10/36* (2021.01); *B22F 10/70* (2021.01); *B22F 12/00* (2021.01); *B22F 12/226* (2021.01); *B22F 12/30* (2021.01); *B22F 12/33* (2021.01); *B22F 12/38* (2021.01); *B22F 12/44* (2021.01); *B22F 12/70* (2021.01); *B22F 12/88* (2021.01); *B22F 12/90* (2021.01); *B23K 15/0006* (2013.01); *B23K 15/0013* (2013.01); *B23K 15/002* (2013.01); *B23K 15/0026* (2013.01); *B23K 15/0093* (2013.01); *B23K 15/06* (2013.01); *B23K 26/03* (2013.01); *B23K 26/032* (2013.01); *B23K 26/083* (2013.01); *B23K 26/0846* (2013.01); *B23K 26/1224* (2015.10); *B23K 26/123* (2013.01); *B23K 26/127* (2013.01);
(Continued)

(58) Field of Classification Search
CPC ......... B29C 35/08; B29C 64/00; B29C 64/20; B29C 64/205; B29C 64/209; B29C 64/245295; B29C 64/30; B33Y 30/00; B33Y 40/00
See application file for complete search history.

(56) References Cited

U.S. PATENT DOCUMENTS 6,682,688 B1 * 1/2004 Higashi .................. B33Y 10/00
264/257

* cited by examiner

*Primary Examiner* — Thu Khanh T. Nguyen
(74) *Attorney, Agent, or Firm* — David R. Stevens; Stevens Law Group

(57) ABSTRACT

Additive manufacturing can involve dispensing a powdered material to form a layer of a powder bed on a support surface of a build platform. A portion of the layer of the powder bed may be selectively melted or fused to form one or more temporary walls out of the fused portion of the layer of the powder bed to contain another portion of the layer of the powder bed on the build platform.

20 Claims, 19 Drawing Sheets

Related U.S. Application Data

(60) Provisional application No. 62/248,787, filed on Oct. 30, 2015, provisional application No. 62/248,966, filed on Oct. 30, 2015, provisional application No. 62/248,847, filed on Oct. 30, 2015, provisional application No. 62/248,776, filed on Oct. 30, 2015, provisional application No. 62/248,969, filed on Oct. 30, 2015, provisional application No. 62/248,841, filed on Oct. 30, 2015, provisional application No. 62/248,799, filed on Oct. 30, 2015, provisional application No. 62/248,770, filed on Oct. 30, 2015, provisional application No. 62/248,989, filed on Oct. 30, 2015, provisional application No. 62/248,848, filed on Oct. 30, 2015, provisional application No. 62/248,980, filed on Oct. 30, 2015, provisional application No. 62/248,833, filed on Oct. 30, 2015, provisional application No. 62/248,791, filed on Oct. 30, 2015, provisional application No. 62/248,835, filed on Oct. 30, 2015, provisional application No. 62/248,795, filed on Oct. 30, 2015, provisional application No. 62/248,758, filed on Oct. 30, 2015, provisional application No. 62/248,783, filed on Oct. 30, 2015, provisional application No. 62/248,968, filed on Oct. 30, 2015, provisional application No. 62/248,765, filed on Oct. 30, 2015, provisional application No. 62/248,839, filed on Oct. 30, 2015, provisional application No. 62/248,780, filed on Oct. 30, 2015, provisional application No. 62/248,829, filed on Oct. 30, 2015, provisional application No. 62/248,821, filed on Oct. 30, 2015.

(51) Int. Cl.

| | | |
|---|---|---|
| *B22F 10/00* | (2021.01) | |
| *B22F 10/28* | (2021.01) | |
| *B22F 10/34* | (2021.01) | |
| *B22F 10/36* | (2021.01) | |
| *B22F 10/70* | (2021.01) | |
| *B22F 12/00* | (2021.01) | |
| *B22F 12/30* | (2021.01) | |
| *B22F 12/33* | (2021.01) | |
| *B22F 12/44* | (2021.01) | |
| *B22F 12/70* | (2021.01) | |
| *B22F 12/88* | (2021.01) | |
| *B22F 12/90* | (2021.01) | |
| *B23K 15/00* | (2006.01) | |
| *B23K 15/06* | (2006.01) | |
| *B23K 26/03* | (2006.01) | |
| *B23K 26/08* | (2014.01) | |
| *B23K 26/12* | (2014.01) | |
| *B23K 26/142* | (2014.01) | |
| *B23K 26/144* | (2014.01) | |
| *B23K 26/16* | (2006.01) | |
| *B23K 26/36* | (2014.01) | |
| *B23K 26/70* | (2014.01) | |
| *B23K 37/04* | (2006.01) | |
| *B25J 11/00* | (2006.01) | |
| *B29C 64/153* | (2017.01) | |
| *B29C 64/264* | (2017.01) | |
| *B29C 64/268* | (2017.01) | |
| *B29C 64/386* | (2017.01) | |
| *B33Y 10/00* | (2015.01) | |
| *B33Y 40/00* | (2020.01) | |
| *B33Y 50/02* | (2015.01) | |
| *B33Y 70/00* | (2020.01) | |
| *B33Y 80/00* | (2015.01) | |
| *B33Y 99/00* | (2015.01) | |
| *G02B 7/14* | (2021.01) | |
| *G02B 7/16* | (2021.01) | |
| *G02B 7/182* | (2021.01) | |
| *G02B 15/04* | (2006.01) | |
| *G02B 15/10* | (2006.01) | |
| *G02B 19/00* | (2006.01) | |
| *G02B 26/08* | (2006.01) | |
| *G02B 27/10* | (2006.01) | |
| *G02F 1/01* | (2006.01) | |
| *G02F 1/1333* | (2006.01) | |
| *G02F 1/135* | (2006.01) | |
| *G05B 17/02* | (2006.01) | |
| *H01S 5/00* | (2006.01) | |
| *H01S 5/40* | (2006.01) | |
| *B22F 10/10* | (2021.01) | |
| *B22F 10/32* | (2021.01) | |
| *B22F 10/47* | (2021.01) | |
| *B22F 10/50* | (2021.01) | |
| *B22F 10/64* | (2021.01) | |
| *B22F 10/73* | (2021.01) | |
| *B22F 12/17* | (2021.01) | |
| *B22F 12/20* | (2021.01) | |
| *B22F 12/41* | (2021.01) | |
| *B22F 12/45* | (2021.01) | |
| *B22F 12/53* | (2021.01) | |
| *B23K 26/00* | (2014.01) | |
| *B23K 26/082* | (2014.01) | |
| *B23K 26/342* | (2014.01) | |
| *B23K 101/00* | (2006.01) | |
| *B23K 101/02* | (2006.01) | |
| *B23K 101/24* | (2006.01) | |
| *B23K 103/00* | (2006.01) | |
| *B28B 1/00* | (2006.01) | |
| *B29K 105/00* | (2006.01) | |
| *B33Y 30/00* | (2015.01) | |
| *G02B 27/00* | (2006.01) | |
| *G02B 27/09* | (2006.01) | |
| *G02B 27/14* | (2006.01) | |
| *G02B 27/28* | (2006.01) | |
| *G07C 3/14* | (2006.01) | |

(52) U.S. Cl.
CPC ......... *B23K 26/142* (2015.10); *B23K 26/144* (2015.10); *B23K 26/16* (2013.01); *B23K 26/36* (2013.01); *B23K 26/702* (2015.10); *B23K 26/703* (2015.10); *B23K 26/704* (2015.10); *B23K 37/0426* (2013.01); *B25J 11/00* (2013.01); *B29C 64/153* (2017.08); *B29C 64/268* (2017.08); *B29C 64/386* (2017.08); *B33Y 10/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 19/0047* (2013.01); *G02B 26/0816* (2013.01); *G02B 27/108* (2013.01); *G02F 1/0136* (2013.01); *G02F 1/133362* (2013.01); *G02F 1/135* (2013.01); *G05B 17/02* (2013.01); *H01S 5/005* (2013.01); *H01S 5/4012* (2013.01); *B22F 2003/247* (2013.01); *B22F 2003/248* (2013.01); *B22F 10/10* (2021.01); *B22F 10/32* (2021.01); *B22F 10/47* (2021.01); *B22F 10/50* (2021.01); *B22F 10/64* (2021.01); *B22F 10/73* (2021.01); *B22F*

12/17 (2021.01); *B22F 12/20* (2021.01); *B22F 12/222* (2021.01); *B22F 12/41* (2021.01); *B22F 12/45* (2021.01); *B22F 12/53* (2021.01); *B22F 2998/10* (2013.01); *B22F 2999/00* (2013.01); *B23K 15/0086* (2013.01); *B23K 26/0006* (2013.01); *B23K 26/082* (2015.10); *B23K 26/342* (2015.10); *B23K 37/0408* (2013.01); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B28B 1/001* (2013.01); *B29K 2105/251* (2013.01); *B33Y 30/00* (2014.12); *G02B 27/0068* (2013.01); *G02B 27/0905* (2013.01); *G02B 27/141* (2013.01); *G02B 27/283* (2013.01); *G02B 27/286* (2013.01); *G05B 2219/49023* (2013.01); *G07C 3/146* (2013.01); *Y02P 10/25* (2015.11); *Y02P 80/40* (2015.11)

VARIABLE PRINT CHAMBER WALLS FOR POWDER BED FUSION ADDITIVE MANUFACTURING

CROSS REFERENCE TO RELATED PATENT APPLICATION

The present disclosure is part of a continuation of U.S. patent application Ser. No. 15/336,690, filed on Oct. 27, 2016, now U.S. Pat. No. 11,072,114, and claiming the priority benefit of the following provisional applications:
U.S. Patent Application No. 62/248,758, filed on Oct. 30, 2015,
U.S. Patent Application No. 62/248,765, filed on Oct. 30, 2015,
U.S. Patent Application No. 62/248,770, filed on Oct. 30, 2015,
U.S. Patent Application No. 62/248,776, filed on Oct. 30, 2015,
U.S. Patent Application No. 62/248,783, filed on Oct. 30, 2015,
U.S. Patent Application No. 62/248,791, filed on Oct. 30, 2015,
U.S. Patent Application No. 62/248,799, filed on Oct. 30, 2015,
U.S. Patent Application No. 62/248,966, filed on Oct. 30, 2015,
U.S. Patent Application No. 62/248,968, filed on Oct. 30, 2015,
U.S. Patent Application No. 62/248,969, filed on Oct. 30, 2015,
U.S. Patent Application No. 62/248,980, filed on Oct. 30, 2015,
U.S. Patent Application No. 62/248,989, filed on Oct. 30, 2015,
U.S. Patent Application No. 62/248,780, filed on Oct. 30, 2015,
U.S. Patent Application No. 62/248,787, filed on Oct. 30, 2015,
U.S. Patent Application No. 62/248,795, filed on Oct. 30, 2015,
U.S. Patent Application No. 62/248,821, filed on Oct. 30, 2015,
U.S. Patent Application No. 62/248,829, filed on Oct. 30, 2015,
U.S. Patent Application No. 62/248,833, filed on Oct. 30, 2015,
U.S. Patent Application No. 62/248,835, filed on Oct. 30, 2015,
U.S. Patent Application No. 62/248,839, filed on Oct. 30, 2015,
U.S. Patent Application No. 62/248,841, filed on Oct. 30, 2015,
U.S. Patent Application No. 62/248,847, filed on Oct. 30, 2015, and
U.S. Patent Application No. 62/248,848, filed on Oct. 30, 2015, which are incorporated by reference in their entirety.

TECHNICAL FIELD

The present disclosure generally relates to powder bed fusion additive manufacturing and, more specifically, to printing variable print chamber walls for powder bed fusion in a powder bed fusion additive manufacturing system.

BACKGROUND

A common practice in powder bed fusion additive manufacturing is to lower a build platform and spread the powder across the top. The walls of the print chamber support the powder, which in turn supports the object(s) printed. Excess powder falls into collection bins along the perimeter and is recycled. Current usages require that the full build area to be filled with powder for each layer printed. While this is feasible for small print areas, the current state of the art is impractical for large build areas with dense or expensive powders.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1A:
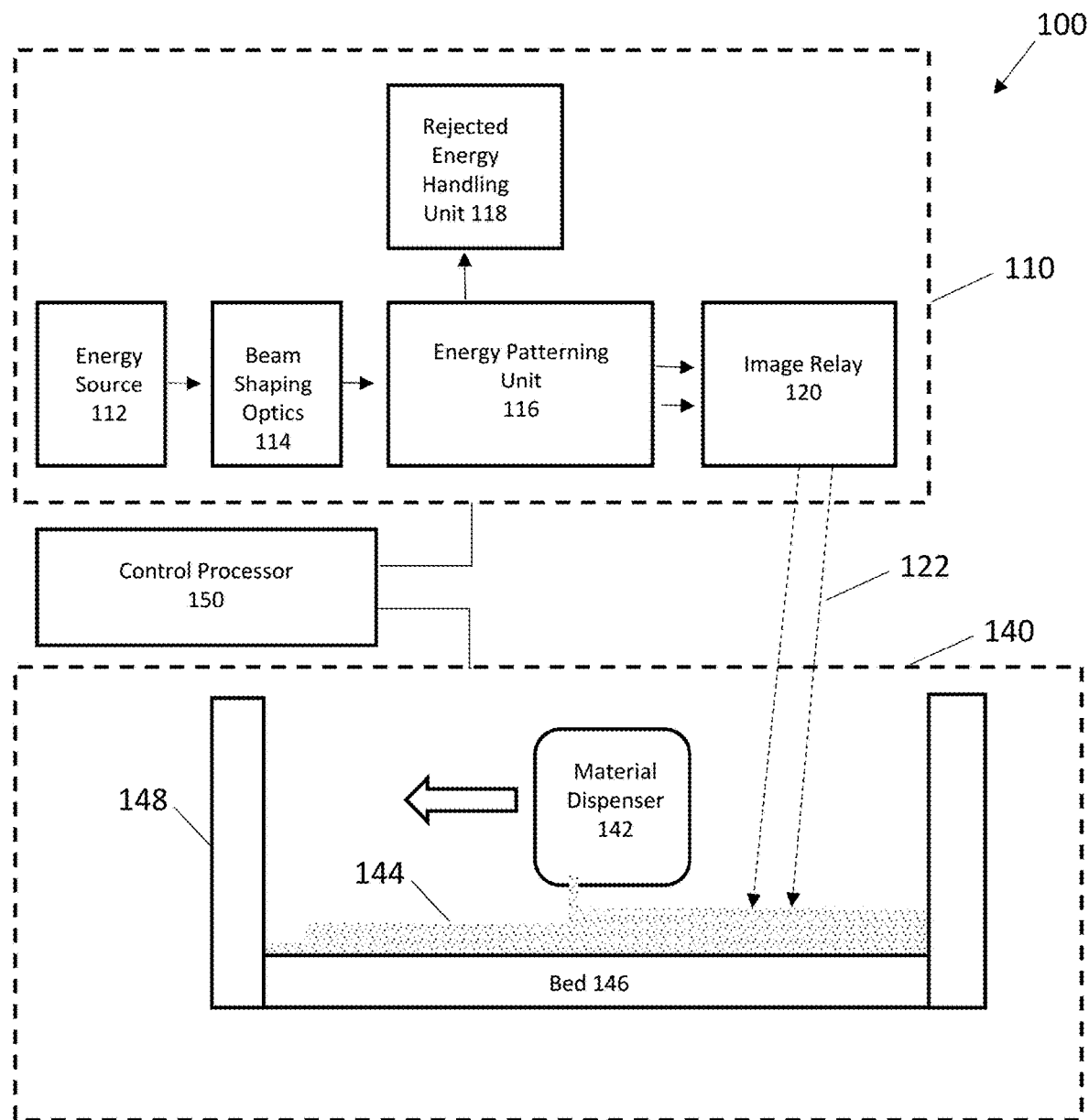
FIG. 1A illustrates an additive manufacturing system.

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

The present disclosure discloses a scheme and techniques pertaining to additive manufacturing systems capable of printing temporary powder bed chamber walls to minimize powder volume requirements during a build operation. The proposed scheme may be implemented in powder bed fusion additive manufacturing systems for printing metal, plastic, or ceramic parts. Applications of the proposed scheme may be more specifically defined as for use in the print bed part of the machine on the receiving end of the laser or electron beam.

In various embodiments of the present disclosure, one or more energy sources of a print head of a powder bed fusion additive manufacturing system may be controlled to print walls or other temporary powder containing structures within of a build chamber. This allows for elimination of the edge walls of the chamber, and can allow for sub-set areas to be created. The presence of sub-set areas/volumes/voids can help minimize powder usage, and enables the creation of volumes devoid of powder. This is especially useful when working with expensive materials such as gold, silver, and copper, and is also useful for working with very large objects where the excess powder can include a very large portion of the standard print volume. Under the proposed scheme, powder may be selectively distributed across the build area in pre-defined walled areas created during the additive manufacturing process.

Since the print bed and the print head are typically vertically separated for successive layers, there is a need for print chamber walls to support previously deposited layers consisting of powder and printed object(s). One example may involve raising to a close-fitting wall. Another example may involve printing a perimeter wall (and perhaps structural support for it) during each layer. This wall may be cut out and recycled after each print.

In some embodiments, most or all of the surrounding walls may be raised, and a wall may be also printed to lessen the powder bed area for the layer of powder while using a "tub" formed by the surrounding walls for catchment of powder falling outside the printed wall.

In some embodiments, the raised wall may be not intended as a full perimeter. For instance, access points for a fork lift or other material handling equipment may be needed when the print bed is first put into the print station and later when the completed bed (powder and printed object(s)) are lifted out. The printing of a limited wall for this area provides the required remaining wall to support the powder during a print cycle. The material handling equipment potentially can then "punch" through this printed wall to gain access to the lift points. In some embodiments, the lift points may be determined by an algorithm or user placement a priori the build and are built into the walls in key locations.

The printed wall does not need to match geometry of the print table, nor exactly match a wall printed in a previous layer. This allows, with the appropriate powder dispensing equipment and logic, powder to be dispersed just enough to cover between the walled areas where powder is needed. Advantageously, this can save a tremendous amount of time, weight and/or powder per layer.

An example beneficial usage of the proposed scheme may be related to the additive manufacturing of a wind turbine blade where only the root is tall and not the emerging blade, particularly if it is pre-bent out of plane and would otherwise protrude (like a hockey stick blade). If the wind turbine blade is 100 m long and at max 8 m wide and 3 m tall, then approximately 2400 $m^3$ of powder may be needed for a fully-filled powder bed. In most places, however, the maximum height is far less, and thus a printed wall allows far less powder to be dispensed. In the case of 10 m pre-bend at tip from mount plane, the amount of powder needed may be 100 m×8 m×10 m, or 8000 $m^3$, to print a single blade. Under the proposed scheme, print boundary may be set to N centimeters to each side of the printed object. The weight of the powdered material can be enormous. The ability to limit the weight on the build platform can help maintain tolerances, use lower cost designs and equipment, and so on. It also simplifies later material handling challenges and the amount of powder that needs to be rescreened during recycling (with attendant cost savings)

Another example beneficial usage of the proposed scheme may be related to the additive manufacturing of a car body and frame with large empty areas in the engine, passenger compartments, trunk(s), wheel wheels, as well as other components of a car. The proposed scheme may print chamber walls on exterior of car body frame as it is printed and with supports and print chamber wall inside of the vehicle. These latter temporary walls may be cut out and recycled. Advantageously, far less powder need to be dispersed and likely at a faster rate.

It is noteworthy that a printed wall does not need to be solid. Rather, a printed wall may need to be sturdy enough to contain bulk of powder and to keep higher up layers from collapsing, even if some powder leaks out of sides later.

Printing wall(s) for large objects, such as wind turbine blades for example, solves a problem of potentially needing a very flat level perimeter frame/wall. This can be very expensive and difficult to keep in alignment—both across prints and during the raise of each successive powder level. Under the proposed scheme, variable printing of the walls melts the top layer(s) at whatever orientation the powder was dispersed, and this is generally a much easier problem at scale.

In another embodiment, temporary walls can be produced to have pipes, cavities, or porous sections (hereinafter "fluid passageways") able to support fluid flow. The fluid passageways can be open, or partially closed, and can be formed to interface with external fluid communication systems. Air, nitrogen, water, high temperature or silicone oils, or other suitable gas or liquid can be circulated or otherwise transferred through a fluid passageway to improve thermal management.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/$MnCl_2$) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate(Nd:$YVO_4$) laser, Neodymium doped yttrium calcium oxoborateNd:$YCa_4O(BO_3)^3$ or simply Nd:YCOB, Neodymium glass(Nd:Glass) laser, Titanium sapphire(Ti:sapphire) laser, Thulium YAG (Tm:YAG) laser, Ytterbium YAG (Yb:YAG) laser, Ytterbium:$2O_3$ (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride(Ce:LiSAF, Ce:LiCAF), Promethium 147 doped phosphate glass(147$Pm^{+3}$:Glass) solid-state laser, Chromium doped chrysoberyl (alexandrite) laser, Erbium doped anderbium-ytterbium co-doped glass lasers, Trivalent uranium doped calcium fluoride (U:$CaF_2$) solid-state laser, Divalent samarium doped calcium fluoride(Sm:$CaF_2$) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
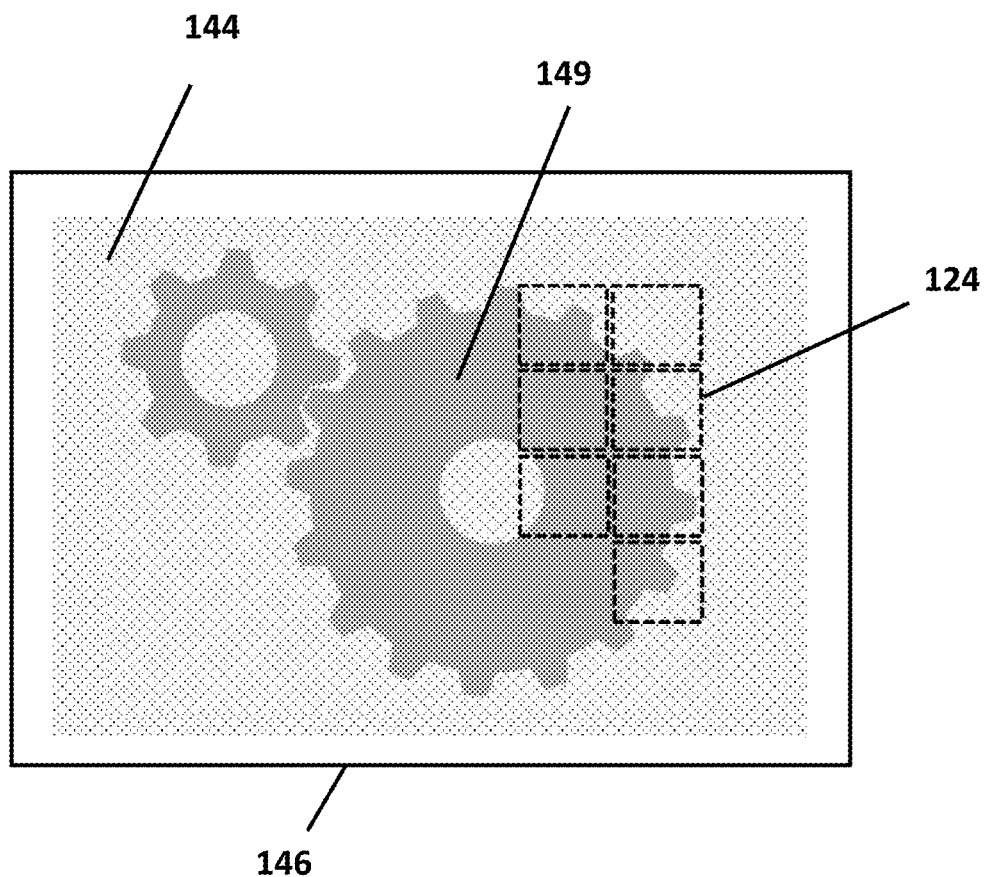
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
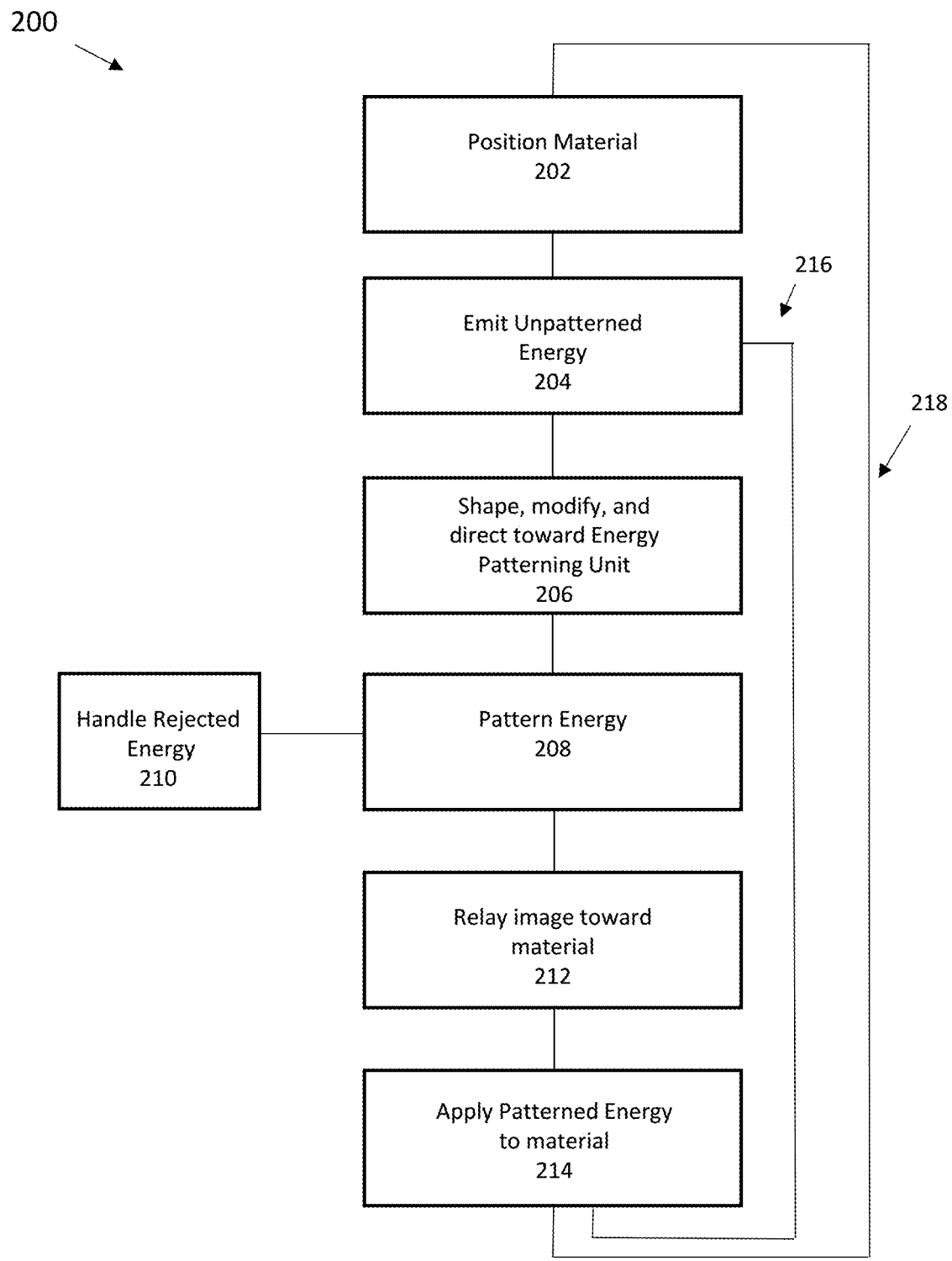
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
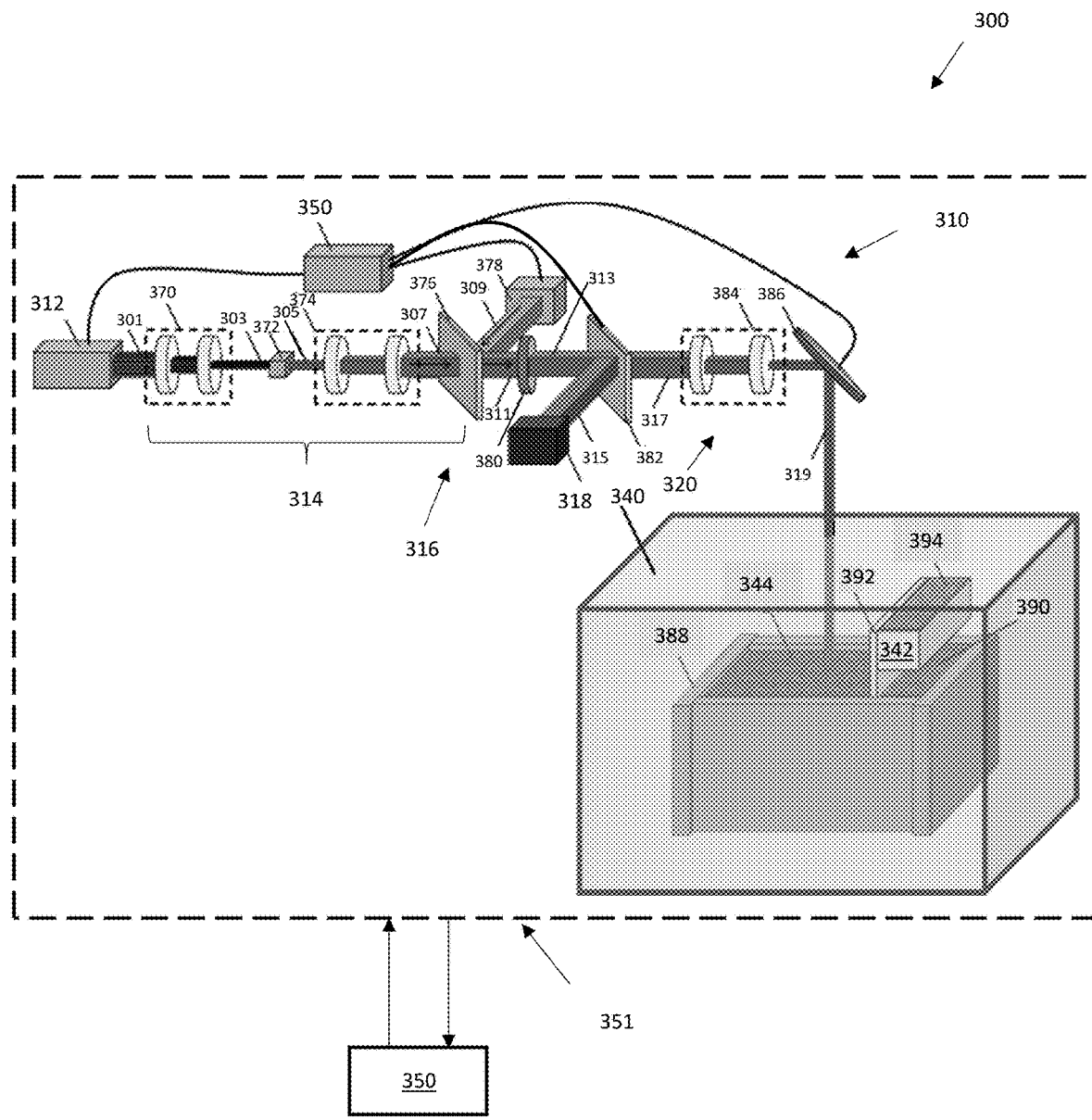
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
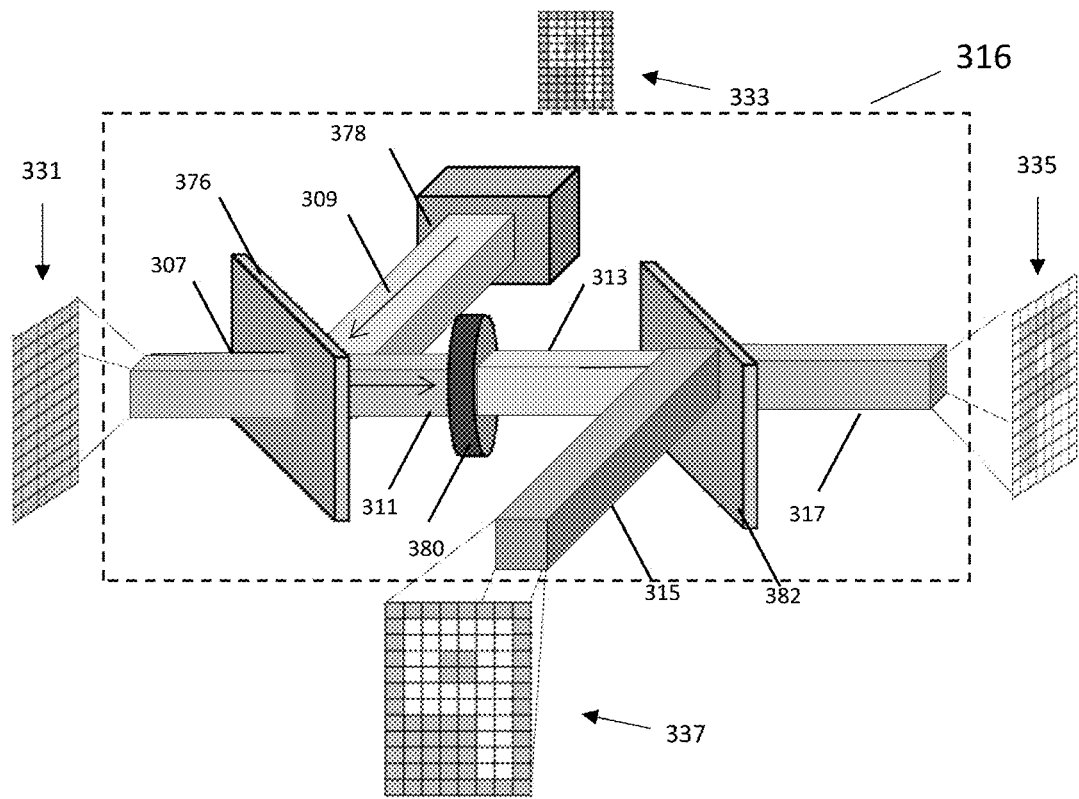
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
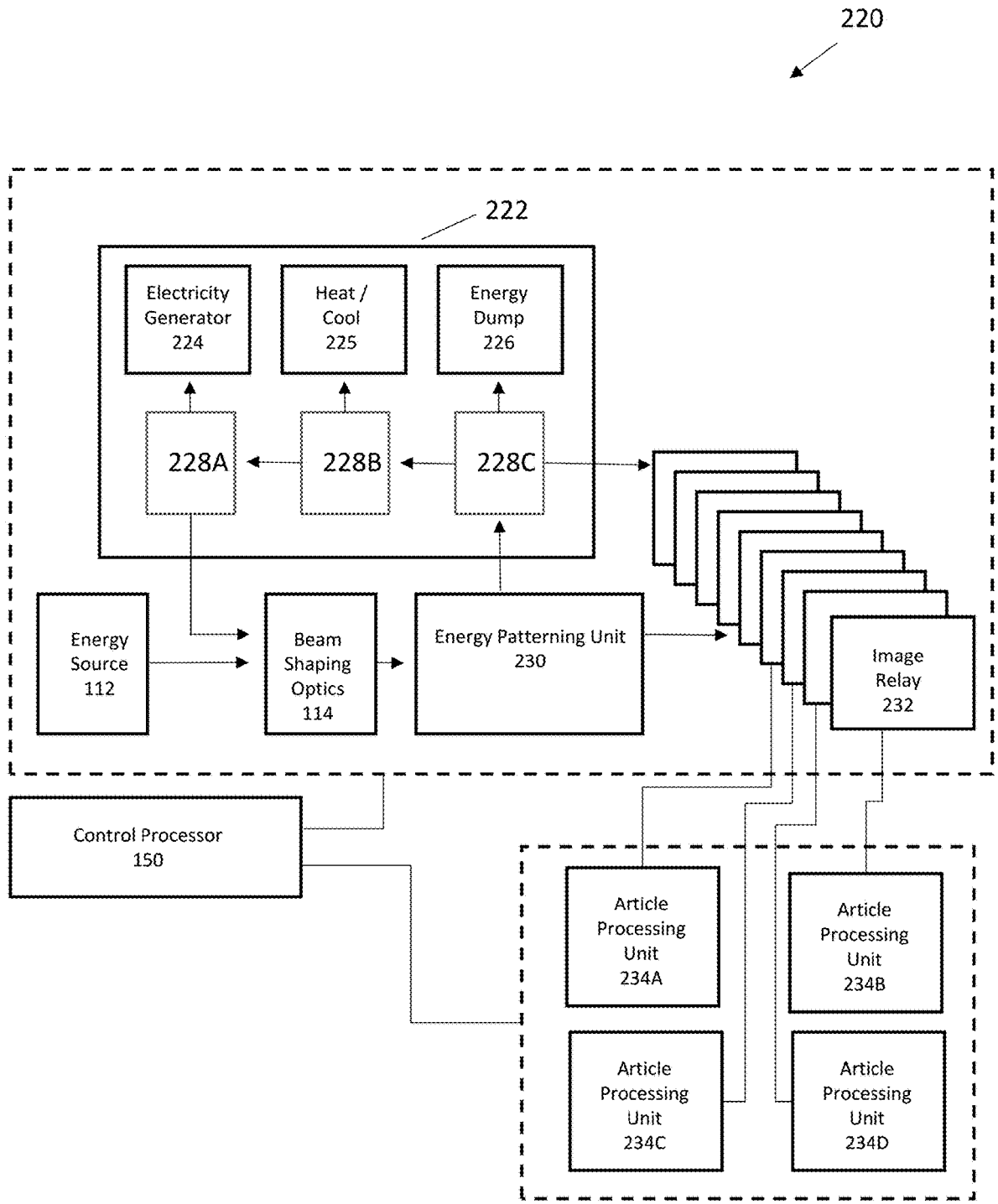
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
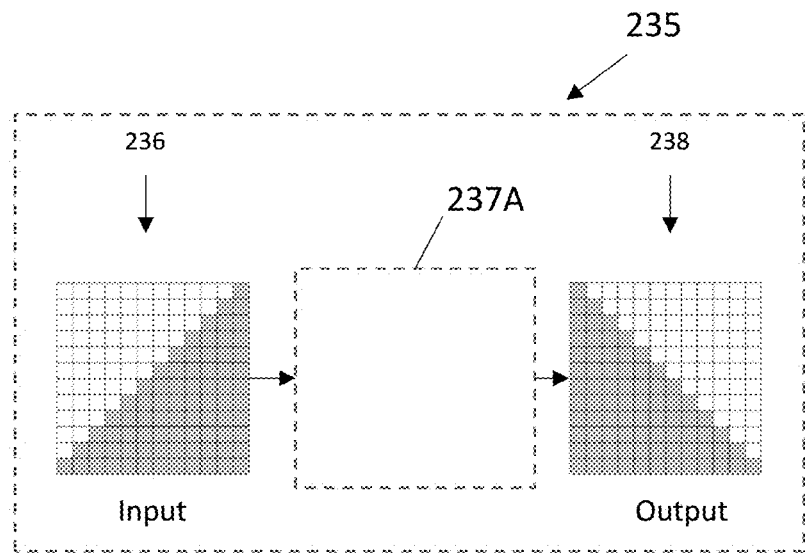
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
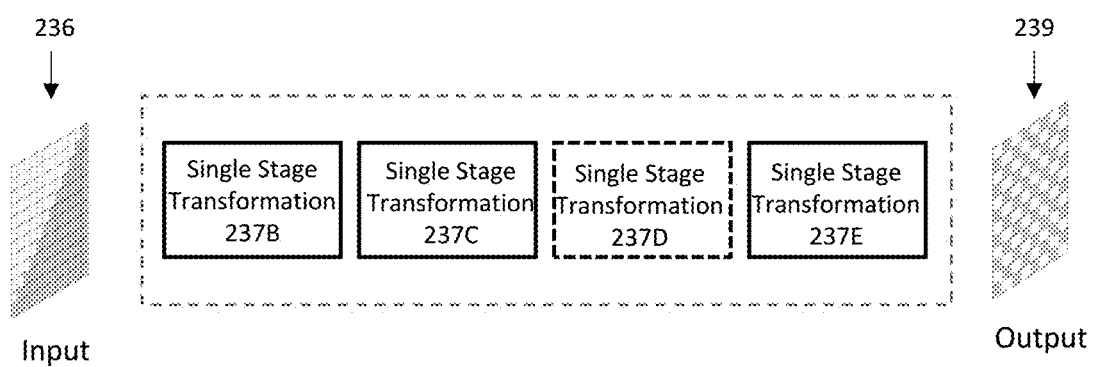
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
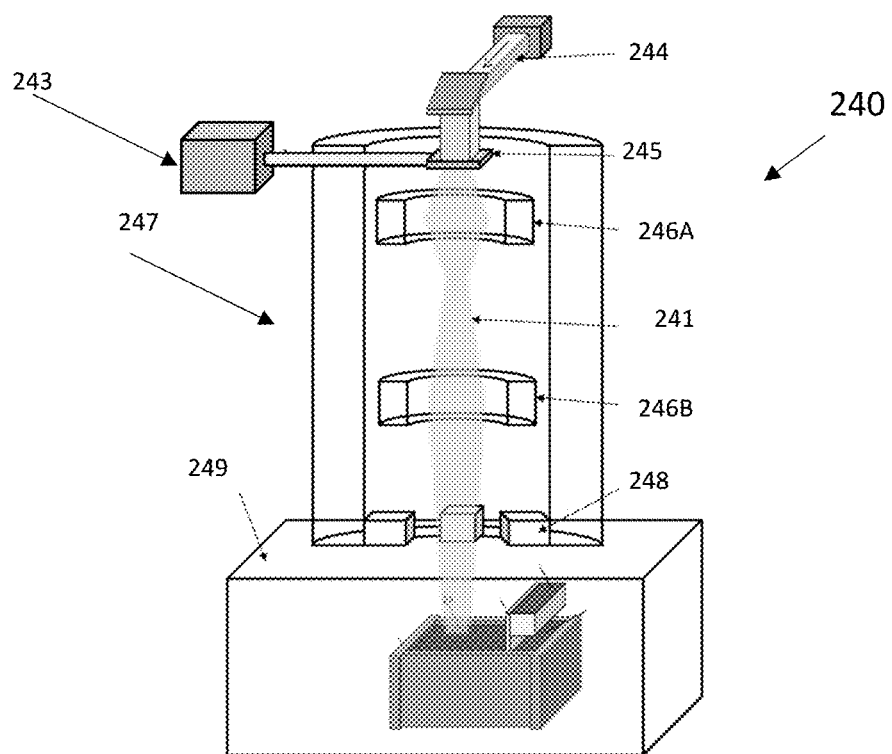
FIG. 3F illustrates an patternable electron energy beam additive manufacturing system.
Figure 3G:
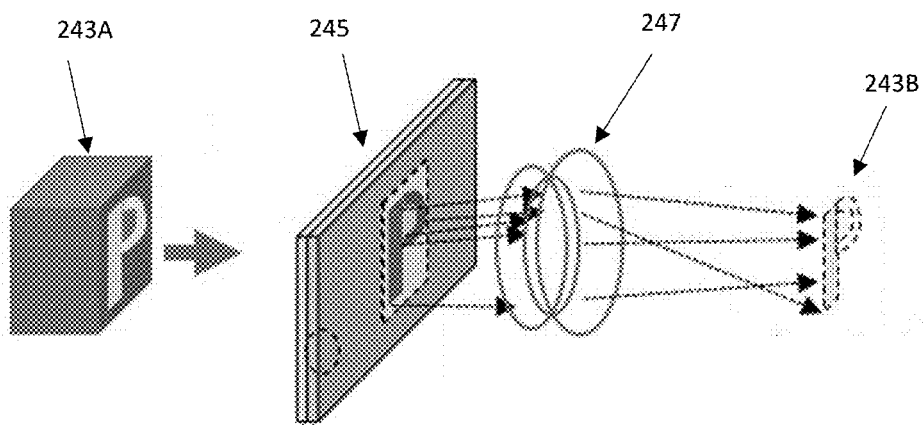
FIG. 3G illustrates a detailed description of the electron beam patterning unit shown in FIG. 3

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

To aid better understanding and appreciation of the proposed scheme, non-limiting examples are provided in FIGS. 4-12. The following description refers to FIGS. 4-12.

Figure 4:
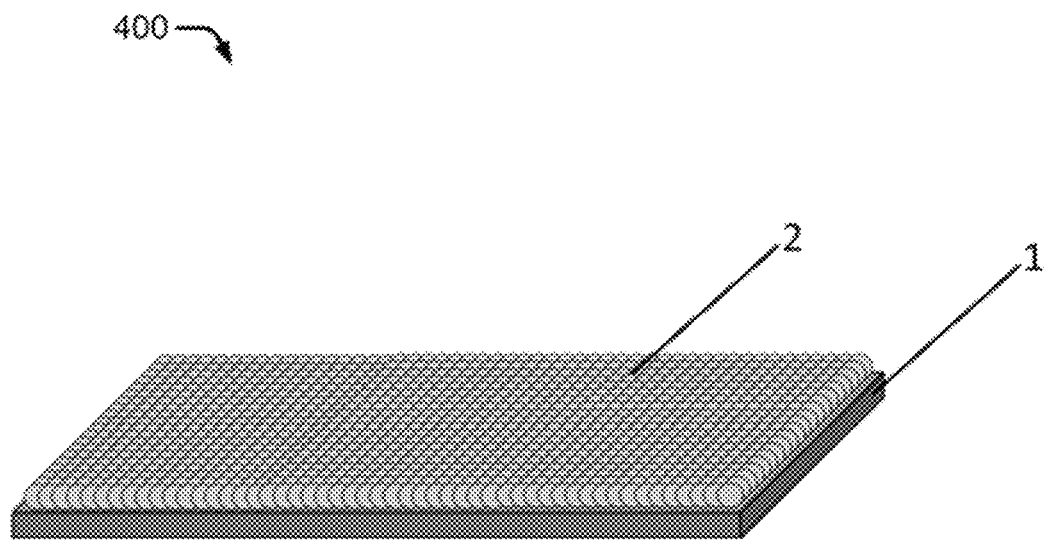
FIG. 4 is a diagram of a single layer of powder spread over a build platform in accordance with the present disclosure.

FIG. 4 illustrates a single layer of powder 2 (e.g., having a diameter of 25 um) spread across a build platform 1.

Figure 5:
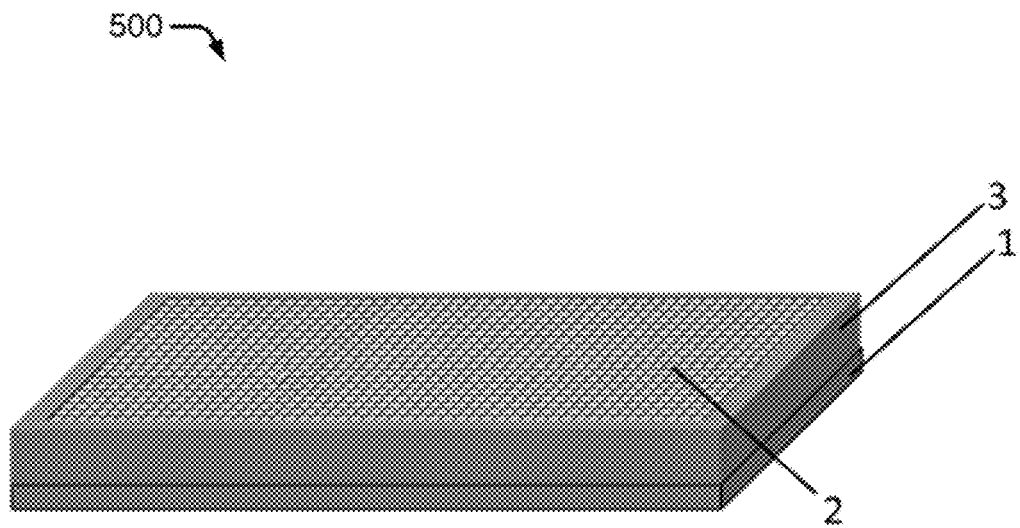
FIG. 5 is a diagram of a wall fused from the original powder layer in accordance with the present disclosure.

FIG. 5 illustrates the single layer of powder 2 spread across build platform 1 where the edges of the powder have been selectively fused by an energy source, which melts the powdered material and bonds it together to form a wall 3. Wall 3 acts as a temporary barrier to contain the current and future layers of powder.

Figure 6:
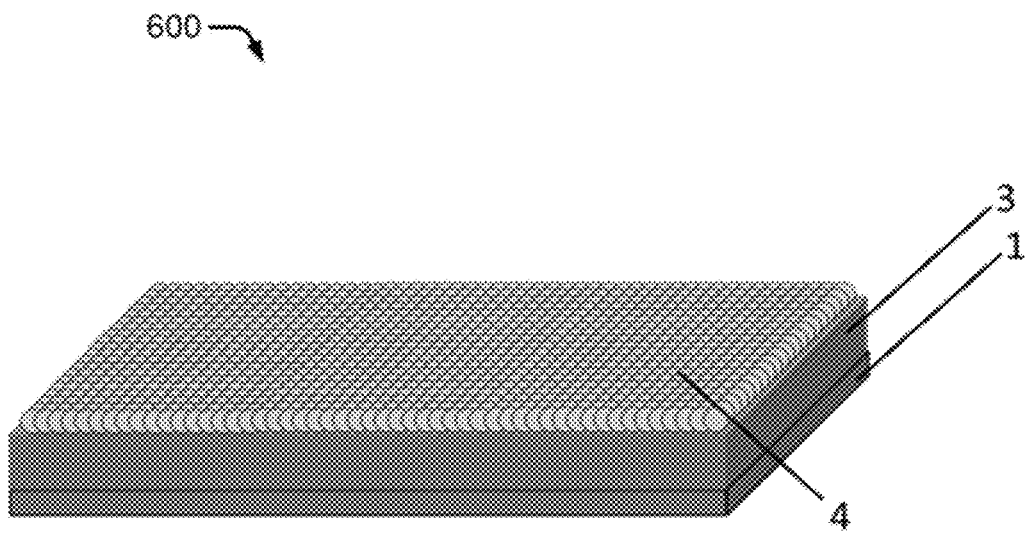
FIG. 6 is a diagram of a new layer of powder spread over the wall/powder/build platform in accordance with the present disclosure.

FIG. 6 illustrates a second single layer of powder 4 spread across the structure shown in FIG. 5.

Figure 7:
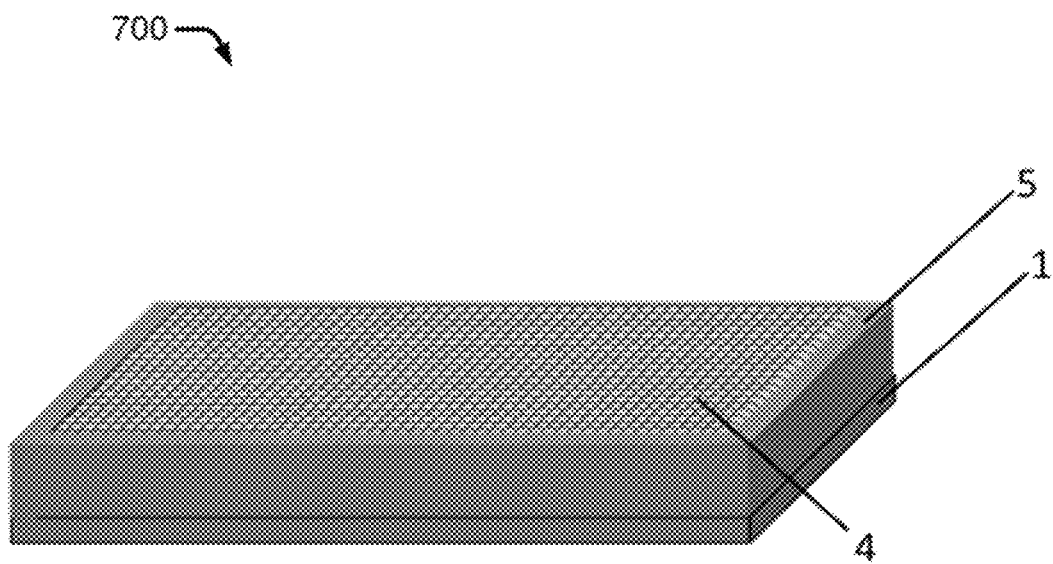
FIG. 7 is a diagram of a second layer of wall fused from the newly spread powder in accordance with the present disclosure.

FIG. 7 illustrates the edges of the second single layer of powder 4 shown in FIG. 6 being fused together by an energy source to create a next layer of wall 5. The aforementioned series of acts defines a process which, when repeated, can be used to construct one or more walls to contain all the powder in the build platform without external supports.

Figure 8:
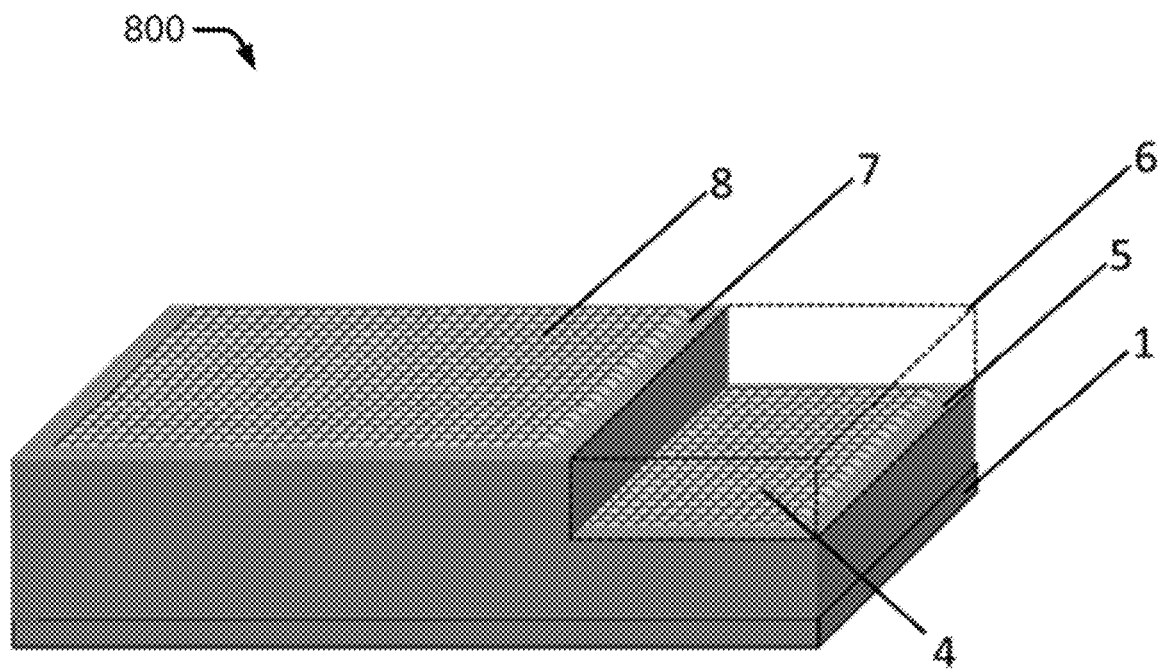
FIG. 8 is a diagram of a subset of the build area walled off to minimize powder usage in accordance with the present disclosure.

FIG. 8 illustrates powder layers deposited then fused on the edges over a subsection of the total build area to form walls 7 to contain layers of powder 8. This subset structure prevents the powdered material from being distributed in volume 6, thereby minimizing powder requirements for the build. This subset structure is built on top of the fused outer edge or wall 5 of multiple powder layers 4 built on top of a build platform 1 such as that shown in FIG. 7.

Figure 9:
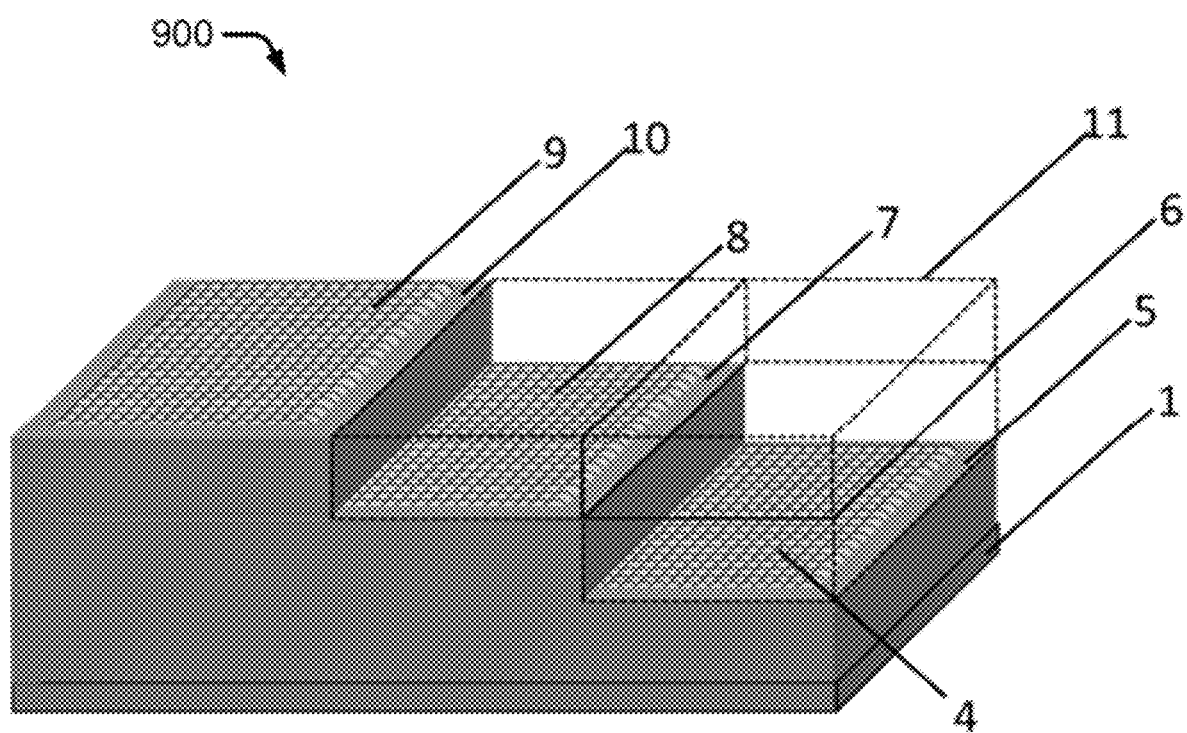
FIG. 9 is a diagram of a further subset of the build area walled off to minimize powder usage in accordance with the present disclosure.

FIG. 9 illustrates powder layers deposited then fused on the edges over a third subsection of the total build area to form walls 10 to contain layers of powder 9. This subset of the build platform further reduces the effective build area size to closely constrain the volume around the part to be printed, thereby eliminating or otherwise minimizing powder usage in volume 11 and volume 6. This subsection is shown built on top of walls 7 the subsection containing layers of powder 8, which is in turn built upon full build platform wall 5, which contains layer(s) of powder 4 spread across build platform 1.

Figure 10:
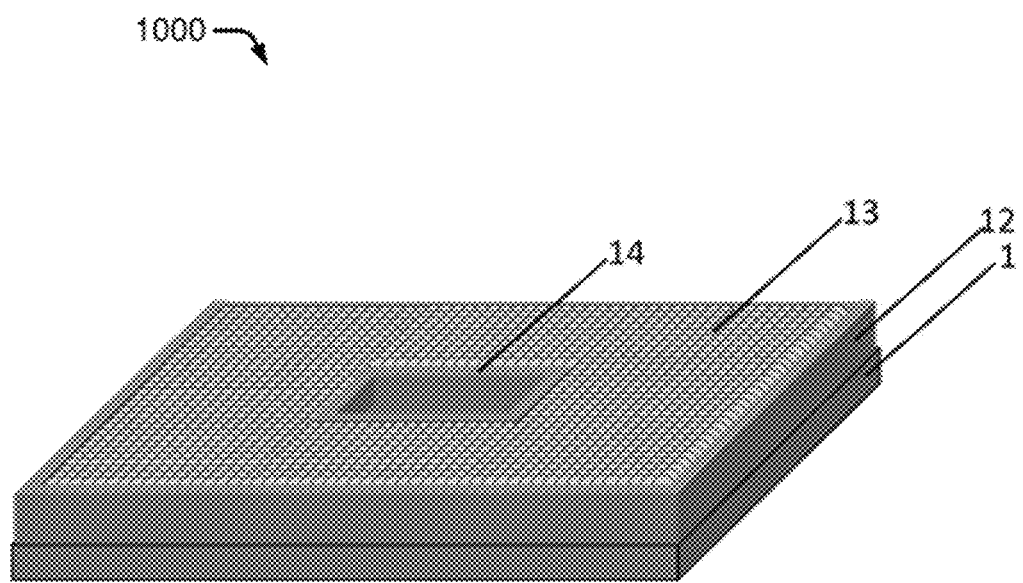
FIG. 10 is a diagram of a subset of the build area walled off to minimize powder usage interior to the total build area in accordance with the present disclosure.

FIG. 10 illustrates layers of powder 13 spread across build platform 1 with walls 12 created from the powder to hold the powder inside the build area. Walls 14 are created internally in the build area to minimize the volume of powder needed during the build.

Figure 11:
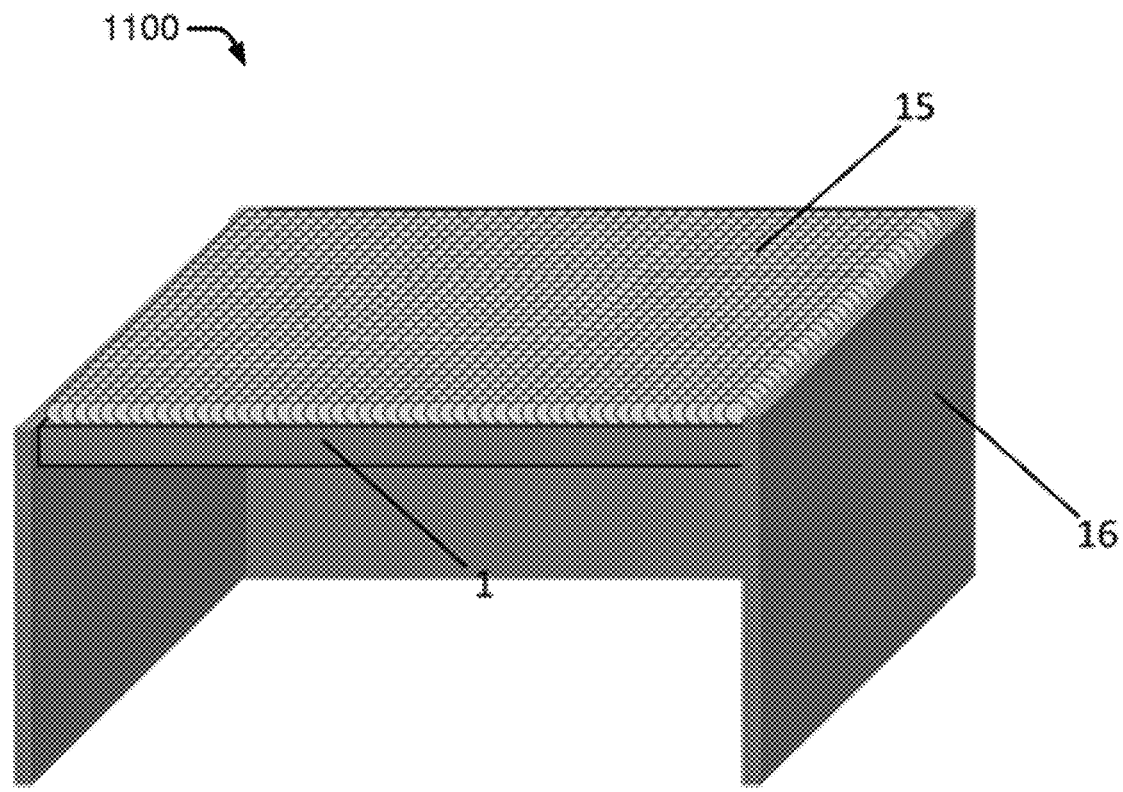
FIG. 11 is a diagram of a build chamber with three walls in accordance with the present disclosure.

FIG. 11 illustrates a layer of powder 15 spread across a build platform 1, surrounded on three sides by structural walls 16 that can move relative to the build platform 1 (e.g., in directions perpendicular to the support surface of build platform 1 on which the layer of powder 15 is deposited). Structural walls 16 prevent powder particles from falling in between the build platform 1 and the structural walls 16.

Figure 12:
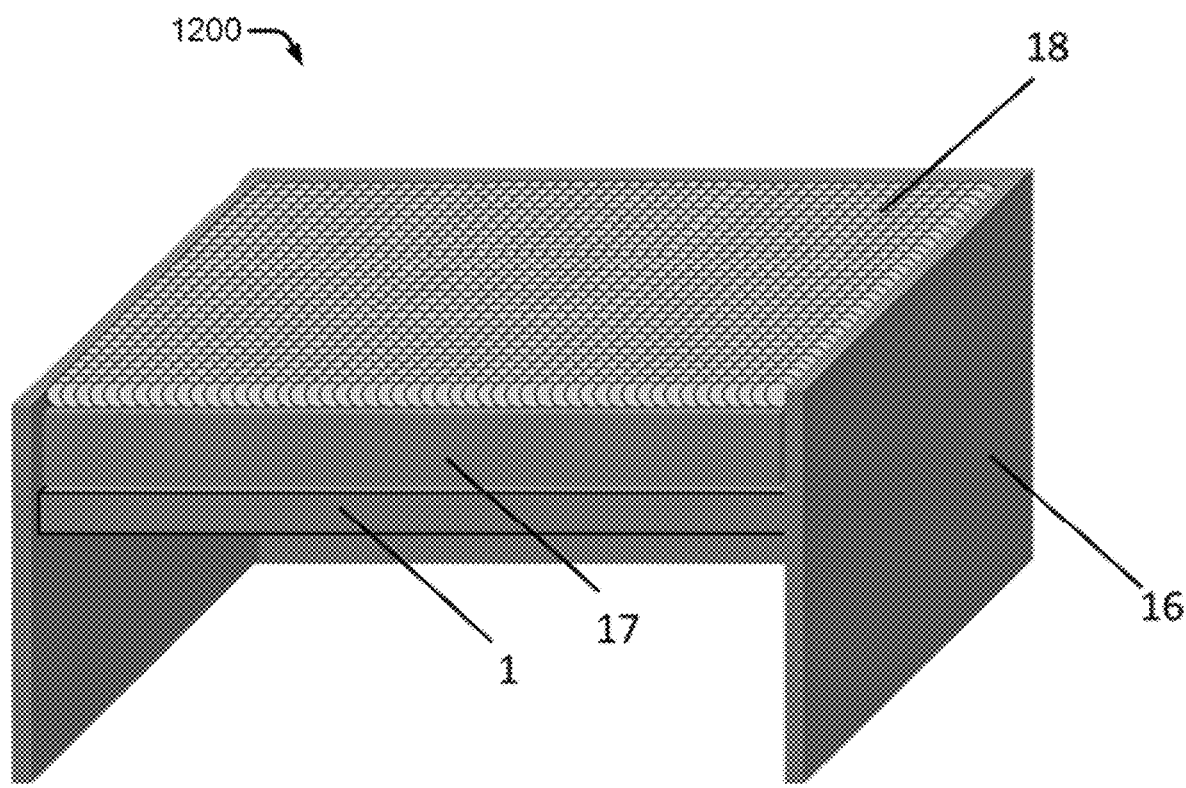
FIG. 12 is a diagram of a build chamber with three walls, the fourth wall being created from deposited powder layer to layer in accordance with the present disclosure.

FIG. 12 illustrates a layer of powder 18 spread across many previous layers of powder on top of build platform 1, supported on three sides by structural walls 16 that can move relative to the build platform 1 in the vertical direction (e.g., in upwards and downwards directions perpendicular to the support surface of build platform 1 on which the layer of powder 15 is deposited). As the build platform 1 moves relative to the structural walls 16, sequential layers of powder may be fused to form a printed wall 17 to support subsequent layers of powder to eventually result in layer of powder 18.

Figure 13:
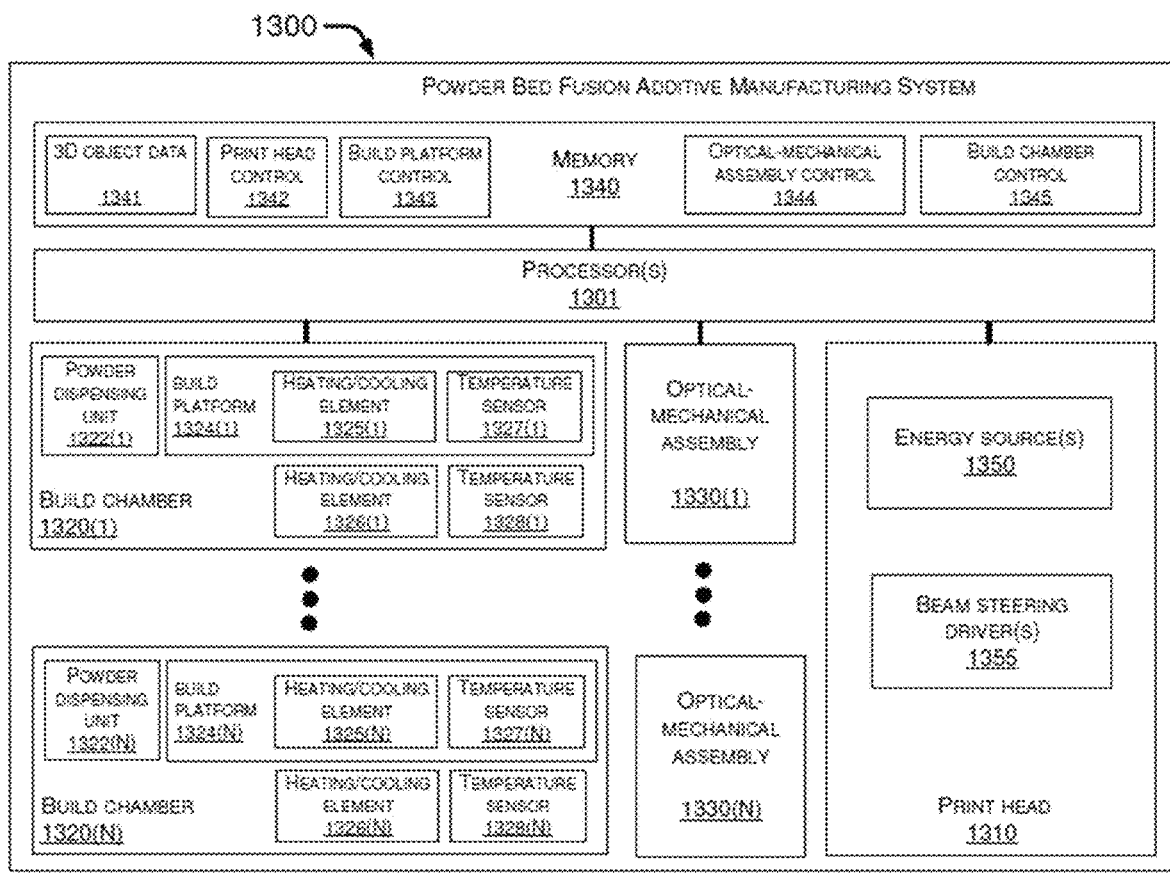
FIG. 13 is a block diagram of an example apparatus in accordance with the present disclosure.

FIG. 13 illustrates an example apparatus of powder bed fusion additive manufacturing system 1300 in which printing variable print chamber walls may be implemented in accordance with an embodiment of the present disclosure. Powder bed fusion additive manufacturing system 1300 may perform various functions related to techniques, methods and systems described herein, including those described below with respect to process 1400. Powder bed fusion additive manufacturing system 1300 may include at least some of the components illustrated in FIG. 13.

In some embodiments, semiconductor laser-based powder bed fusion additive manufacturing system 1300 may include one or more build chambers. For illustrative purpose and without limitation, one or more build chambers of system 1300 are shown in FIG. 13 as build chambers 1320(1)-1320(N), with N being a positive integer greater than or equal to 1. Build chambers 1320(1)-1320(N) may include powder dispensing units 1322(1)-1322(N) for dispensing powdered materials and build platforms 1324(1)-1324(N) to support powder beds formed by powdered materials. Each of build chambers 1320(1)-1320(N) may have a different size and may be swappable among each other within semiconductor laser-based powder bed fusion additive manufacturing system 1300. Build chambers 1320(1)-1320(N) may have removable doors to facilitate powder removal from a side of build chambers 1320(1)-1320(N) after a build. Build chambers 1320(1)-1320(N) may be sealed in an atmosphere during powder bed fusion additive manufacturing. The atmosphere may include, but not limited to, air, nitrogen, argon, or helium.

In some embodiments, walls/ceilings of build chambers 1320(1)-1320(N) may be embedded with heating/cooling elements 1326(1)-1326(N) and temperature sensors 1328(1)-1328(N) to control the thermal environment inside build chambers 1320(1)-1320(N).

In some embodiments, heating/cooling elements 1326(1)-1326(N) may include fluid channels capable of heat exchange. The fluid may be heated or cooled outside build chambers 1320(1)-1320(N) and perform heat exchange with the walls/ceilings by moving fluid through the fluid channels. The fluid may include, but not limited to, an oil, water, steam, air, nitrogen, argon, or a coolant.

In some embodiments, heating/cooling elements 1326(1)-1326(N) may include resistive heating elements and thermionic cooling elements respectively.

In some embodiments, temperature sensors 1328(1)-1328(N) may include thermocouples embedded inside walls/ceilings of inside build chambers 1320(1)-1320(N).

In some embodiments, temperature sensors 1328(1)-1328(N) may include infrared camera(s) mounted on walls/ceilings inside build chambers 1320(1)-1320(N).

In some embodiments, each of build chambers 1320(1)-1320(N) may include radiation shields on walls/ceilings of build chambers 1320(1)-1320(N) to reduce heat loss.

In some embodiments, build chambers 1320(1)-1320(N) may include low thermal conductance materials as parts of walls/ceilings.

In some embodiments, each of build platforms 1324(1)-1324(N) may be capable of vertical motions or being fixed at a given height during powder bed fusion additive manufacturing. Build platforms 1324(1)-1324(N) may have different sizes and support variable masses of powder beds. Build platforms 1324(1)-1324(N) may be removable from build chambers 1320(1)-1320(N) on rails, wheels or other means.

In some embodiments, each of build platforms 1324(1)-1324(N) may be embedded with heating/cooling elements 1325(1)-1325(N) and temperature sensors 1327(1)-1327(N).

In some embodiments, heating/cooling elements 1325(1)-1325(N) may include fluid channels capable of heat exchange. The fluid may be heated or cooled outside build chambers 1320(1)-1320(N) and perform heat exchange with the walls/ceilings by moving fluid through the fluid channels. The fluid may include, but not limited to, oil, water, steam, air, nitrogen, argon, or a coolant.

In some embodiments, heating/cooling elements 1325(1)-1325(N) may include resistive heating elements and thermionic cooling elements respectively.

In some embodiments, temperature sensors 1327(1)-1327(N) may include thermocouples embedded inside walls/ceilings of inside build chambers 1320(1)-1320(N).

Semiconductor laser-based powder bed fusion additive manufacturing system 1300 may include optical-mechanical assemblies 1330(1)-1330(N) associated with build chambers 1320(1)-1320(N) respectively for directing incident beams onto respective build area inside build chambers 1320(1)-1320(N).

Optical-mechanical assemblies 1330(1)-1330(N) may include convex lenses, concave lenses, mirrors, and other reflective/refractive components. Optical-mechanical assemblies 1330(1)-1330(N) may further include a mechanical structure configured to support and adjust positions or angles of convex lenses, concave lenses, mirrors, and other reflective/refractive components.

In some embodiments, optical-mechanical assemblies 1330(1)-1330(N) may be height adjustable in a vertical direction during powder bed fusion additive manufacturing.

Semiconductor laser-based powder bed fusion additive manufacturing system 1300 may include print head 1310 capable of providing one or more incident beams to build chambers 1320(1)-1320(N). Print head 1310 may further include one or more energy sources 1350 and beam steering driver(s) 1355. The one or more energy sources 1350 may be solid state lasers or semiconductor lasers capable of generating enough beam intensity to melt/sinter/amalgamate or otherwise process powdered materials. Beam steering driver(s) may include reflective/refractive optical components to split a main beam into multiple incident beams for respective build chambers 1320(1)-1320(N).

In some embodiments, print head 1310 may be height adjustable in a vertical direction together with optical-mechanical assemblies 1330(1)-1330(N) during powder bed fusion additive manufacturing.

In some embodiments, semiconductor laser-based powder bed fusion additive manufacturing system 1300 may include memory device 1340 configured to store 3D object data 1341 and one or more programs and/or sets of instructions such as print head control 1342, build platform control 1343, optical-mechanical assembly control 1344, and build chamber control 1345. 3D object data 1341 may contain geometrical information of two dimensional slices of a 3D object. Print head control 1342 may contain programs for controlling an intensity, a direction, a timed duration of incident beams. Build platform control 1343 may contain programs for controlling a temperature and a height of a respective build platform. Optical-mechanical assembly control 1344 may contain programs for controlling a height of a respective optical-mechanical assembly and a location of the incident beam on a powder bed. Build chamber control 1345 may contain programs for controlling powder dispensing and a temperature of the powder bed inside a respective build chamber.

In some embodiments, semiconductor laser-based powder bed fusion additive manufacturing system 1300 may include a processor 1301. Processor 1301 may be coupled to memory device 1340 to access data stored therein and to execute any programs/instructions stored therein. Processor 1301 may determine how many 3D objects can be printed concurrently based on total energy requirement of bonding the powdered materials that form the 3D objects. Processor 1301 may then determine an intensity and a timed duration of the respective incident beam for each 3D object. Assignments of build chambers 1320(1)-1320(N) for the 3D objects to be printed concurrently may be based on the size of the 3D object or based on previously processed powdered materials inside build chambers 1320(1)-1320(N). Processor 1301 may execute print head control 1342 to set an intensity and a timed duration for an incident beam, and beam steering drive(s) 1355 may direct each incident beam towards the respective build chamber. Processor 1301 may receive 3D object data from memory 1340 to coordinate movements of optical-mechanical assemblies 1330(1)-1330(N) according to the geometrical information of two dimensional slices of the 3D object. Processor 1301 may execute optical-mechanical assembly control 1344 to focus the incident beam on the top surface of the powder bed and allow the incident beam following the geometrical information of two dimensional slices during powder bed fusion additive manufacturing. Processor 1301 may execute build chamber control 1345 to control powder dispensing such as layer thickness, rate of dispensing, and compaction. Temperature data from temperature sensors 1328(1)-1328(N) may be received by processor 1301 and a temperature control algorithm in build chamber control 1345 may determine to heat or cool the respective build chamber according to processing requirements. During a build, processor 1301 may execute build platform control 1343 to index build platforms 1324(1)-1324(N) downwards to maintain an essentially constant depth of field as layers of powders are being successively dispensed on to the powder bed.

In some embodiments, build platforms 1324(1)-1324(N) may be locked at a fixed height during a build as layers of powders are being successively dispensed onto the powder bed. Processor 1301 may control print head 1310 and optical-mechanical assemblies 1330(1)-1339(N) indexing upwards to maintain an essentially constant depth of field as opposed to downward movements of build platforms 1324(1)-1324(N).

Under the proposed scheme, print head 1310 may include one or more light sources 1350 configured to emit one or more beams of light. Each of build chambers 1320(1)-1320(N) may respectively include a build platform 1324(X) having a support surface and a powder dispensing unit 1322(X) configured to dispense a powdered material on the support surface of the build platform 1324(X), where X is between 1 and N. The optical-mechanical assemblies 1330(1)-1330(N) may be arranged to receive and direct the one or more beams of light into the build chambers 1320(1)-1320(N), respectively. Processor 1301 may be communicatively coupled to control operations of the print head 1310, the build chambers 1320(1)-1320(N) and the optical-mechanical assemblies 1330(1)-1330(N). In some embodiments, processor 1301 may control each of powder dispensing units 1322(1)-1322(N) to dispense the powdered material to form a first layer of a powder bed on the support surface of the respective build platform 1324(1)-1324(N). Processor 1301 may also control the one or more light sources 1350 to emit the one or more beams of light to selectively fuse a portion of the first layer of the powder bed to form one or more first walls out of the fused portion of the first layer of the powder bed such that the one or more first walls contain another portion of the first layer of the powder bed on the build platform 1324(1)-1324(N).

In some embodiments, the one or more first walls may include multiple walls surrounding an area interior of the build platform to create a region devoid of the powdered material.

In some embodiments, processor 1301 may control each of the powder dispensing units 1322(1)-1322(N) to dispense the powdered material to form a second layer of the powder bed on the first layer of the powder bed. Processor 1301 may also control the one or more light sources 1350 to emit the one or more beams of light to selectively fuse a portion of the second layer of the powder bed to form one or more second walls out of the fused portion of the second layer of the powder bed such that the one or more second walls contain another portion of the second layer of the powder bed.

In some embodiments, the one or more first walls may include multiple first walls surrounding the another portion of the first layer of the powder bed over a first area of the build platform. The one or more second walls may include multiple second walls surrounding the another portion of the second layer of the powder bed over a second area of the first layer of the powder bed, with the second area being smaller than the first area.

In some embodiments, the one or more first walls may include at least one wall along at least one perimeter of multiple perimeters of the build platform. The remaining one or more perimeters of the multiple perimeters of the build platform may border one or more structural walls. In such cases, processor 1301 may cause a relative movement between the build platform 1324(1)-1324(N) and the one or more structural walls in a direction perpendicular to the support surface of the build platform 1324(1)-1324(N). Processor 1301 may also control each of the powder dispensing units 1322(1)-1322(N) to dispense the powdered material on the first layer of the powder bed and the one or more first walls to form a second layer of the powder bed. Processor 1301 may further control the one or more light sources to emit the one or more beams of light to selectively fuse a portion of the second layer of the powder bed to increase a height of the one or more first walls.

In some embodiments, the one or more light sources 1350 may include at least a solid state laser or a semiconductor laser.

In some embodiments, the powdered material may include a metal, ceramic, or plastic material.

Figure 14:
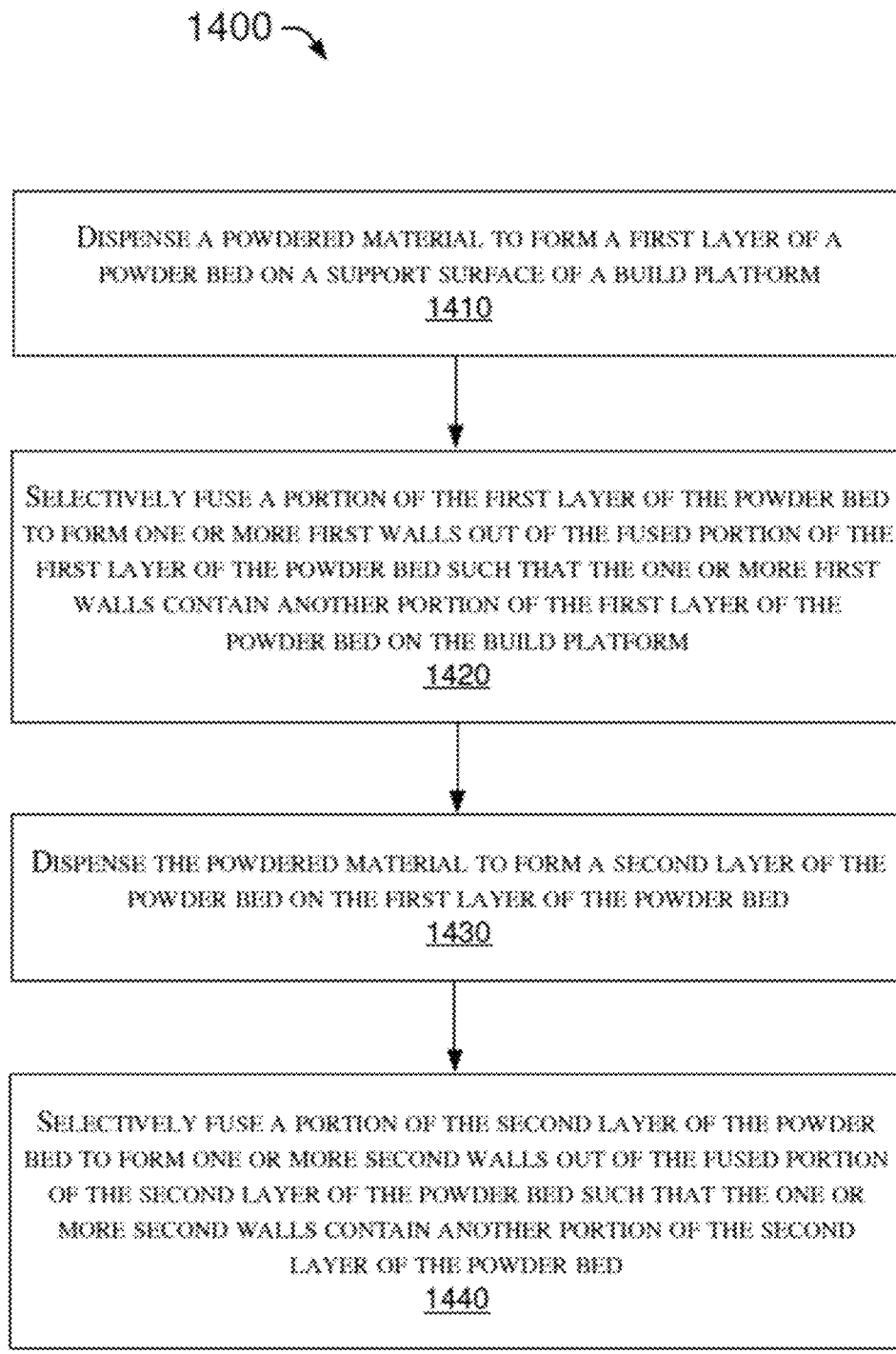
FIG. 14 is a flowchart of an example process in accordance with the present disclosure.

FIG. 14 illustrates an example process 1400 in accordance with the present disclosure. Process 1400 may be utilized to realize printing variable print chamber walls for powder bed fusion in a powder bed fusion additive manufacturing system in accordance with the present disclosure. Process 1400 may include one or more operations, actions, or functions shown as blocks such as 1410, 1420, 1430 and 1440. Although illustrated as discrete blocks, various blocks of process 1400 may be divided into additional blocks, combined into fewer blocks, or eliminated, depending on the desired implementation, and may be performed or otherwise carried out in an order different from that shown in FIG. 14. Process 1400 may be implemented by apparatus 1300 and the powder bed fusion additive manufacturing system shown in FIGS. 1A-3B. Process 1400 may begin with block 1410.

At 1410, process 1400 may involve dispensing a powdered material to form a first layer of a powder bed on a support surface of a build platform. Process 1400 may proceed from 1410 to 1420.

At 1420, process 1400 may involve selectively fusing a portion of the first layer of the powder bed to form one or more first walls out of the fused portion of the first layer of the powder bed. The one or more first walls may contain another portion of the first layer of the powder bed on the build platform. In some embodiments, the one or more first walls may include multiple walls surrounding an area interior of the build platform to create a region devoid of the powdered material. Process 1400 may proceed from 1420 to 1430.

At 1430, process 1400 may involve dispensing the powdered material to form a second layer of the powder bed on the first layer of the powder bed. Process 1400 may proceed from 1430 to 1440.

At 1440, process 1400 may involve selectively fusing a portion of the second layer of the powder bed to form one or more second walls out of the fused portion of the second layer of the powder bed. The one or more second walls may contain another portion of the second layer of the powder bed.

In some embodiments, the one or more first walls may include multiple first walls surrounding the another portion of the first layer of the powder bed over a first area of the build platform. Moreover, the the one or more second walls may include multiple second walls surrounding the another portion of the second layer of the powder bed over a second area of the first layer of the powder bed, with the second area being smaller than the first area.

In some embodiments, the one or more first walls may include at least one wall along at least one perimeter of multiple perimeters of the build platform. Additionally, the remaining one or more perimeters of the multiple perimeters of the build platform may border one or more structural walls. In some embodiments, process 1400 may further involve causing a relative movement between the build platform and the one or more structural walls in a direction perpendicular to the support surface of the build platform. Moreover, process 1400 may involve dispensing the powdered material on the first layer of the powder bed and the one or more first walls to form a second layer of the powder bed. Furthermore, process 1400 may involve selectively fusing a portion of the second layer of the powder bed to increase a height of the one or more first walls.

In another embodiment, temporary walls can be produced to have pipes, cavities, or porous sections (hereinafter "fluid passageways") able to support fluid flow. The fluid passageways can be open, or partially closed, and can be formed to interface with external pipes, hoses, sprayers, or other fluid communication systems. Air, nitrogen, water, high temperature or silicone oils, or other suitable gas or liquid can be circulated or otherwise transferred through a fluid passageway to improve thermal management. Thermal management can include both fast or controlled cooling, and the fluid can be circulated (e.g. through pipes formed in the temporary walls) or sprayed, dripped, or splashed against, for example, a porous outer wall section.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A method, comprising:
    dispensing a powdered material to form a first layer of a powder bed on a support surface of a build platform for printing an object;
    selectively fusing, based on a volume of the object being printed, a first portion of the powdered material in the first layer of the powder bed to form a first enclosure that contains within at least one part of the remaining unfused powdered material in the first layer of the powder bed on the build platform, the first enclosure staying in direct contact with the remaining unfused powdered material; and printing the object on the build platform using the powdered material contained by the first enclosure.

2. The method of claim 1, further comprising selectively fusing a second portion of the powdered material of the first layer of the powder bed to form a second enclosure surrounding an area interior of the build platform to create a region devoid of the powdered material.

3. The method of claim 1, further comprising:
dispensing the powdered material to form a second layer of the powder bed on the first layer of the powder bed;
selectively fusing, based on the volume of the object, a portion of the powdered material of the second layer of the powder bed to form a second enclosure containing another portion of the remaining unfused powdered material of the second layer of the powder bed; and
printing the object on the build platform using the powdered material contained by the first and second enclosures.

4. The method of claim 3, wherein the first enclosure comprises multiple powder containing walls surrounding a first area in the first layer of the powder bed of the build platform, wherein the second enclosure comprises multiple powder containing walls surrounding a second area in the second layer of the powder bed above the first layer of the powder bed, and wherein the second area is smaller than the first area.

5. The method of claim 1, wherein the first enclosure comprises at least one powder containing wall along at least a first perimeter of multiple perimeters of the build platform, and wherein a remaining second perimeter of the multiple perimeters of the build platform borders one or more structural walls that surrounds the first layer of the powder.

6. The method of claim 5, further comprising:
causing a relative movement between the build platform and the one or more structural walls in a direction perpendicular to the support surface of the build platform;
dispensing the powdered material on the first layer of the powder bed and the first enclosure to form a second layer of the powder bed; and
selectively fusing a portion of the second layer of the powder bed to increase a height of the first enclosure.

7. The method of claim 1, wherein the powdered material comprises a metal, ceramic, or plastic material.

8. A method, comprising:
dispensing a powdered material to form a first layer of a powder bed on a support surface of a build platform for printing an object;
controlling one or more light sources to emit one or more beams of light to selectively fuse, based on a volume of the object being printed, a first portion of the powdered material of the first layer of the powder bed to form a first enclosure that contains within at least one part of the remaining unfused powdered material in the first layer of the powder bed on the build platform, the first enclosure staying in direct contact with the remaining unfused powdered material;
controlling heating and cooling elements to control a temperature of the build platform; and
printing the object on the build platform using the powdered material contained by the first enclosure.

9. The method of claim 8, further comprising selective fusing a second portion of the powdered material of the first layer of the powder bed to form a second enclosure surrounding an area interior of the build platform to create a region devoid of the powdered material.

10. The method of claim 8, wherein the first enclosure comprises at least one powder containing wall along at least a first perimeter of multiple perimeters of the build platform, and wherein a remaining second perimeter of the multiple perimeters of the build platform borders one or more structural walls that surrounds the first layer of the powder.

11. The method of claim 10, further comprising:
causing a relative movement between the build platform and the one or more structural walls in a direction perpendicular to the support surface of the build platform;
dispensing the powdered material on the first layer of the powder bed and the first enclosure to form a second layer of the powder bed; and
controlling the one or more light sources to emit the one or more beams of light to selectively fuse a portion of the second layer of the powder bed to increase a height of the first enclosure.

12. The method of claim 8, wherein the one or more light sources comprise at least a fiber laser or a diode laser.

13. The method of claim 8, further comprising:
dispensing the powdered material to form a second layer of the powder bed on the first layer of the powder bed; and
controlling the one or more light sources to emit the one or more beams of light to selectively fuse, based on a volume of the object, a portion of the powdered material of the second layer of the powder bed to form a second enclosure containing another portion of the remaining unfused powdered material of the second layer of the powder bed; and
printing the object on the build platform using the powdered material contained by the first and second enclosures.

14. The method of claim 13, wherein the first enclosure comprises multiple powder containing walls surrounding a first area in the first layer of the powder bed of the build platform, wherein the second enclosure comprises multiple powder containing walls surrounding a second area in the second layer of the powder bed above the first layer of the powder bed, and wherein the second area is smaller than the first area.

15. A system comprising one or more processing units configured to perform operations comprising:
dispensing a powdered material to form a first layer of a powder bed on a support surface of a build platform for printing an object;
selectively fusing, based on a volume of the object, a first portion of the powdered material in the first layer of the powder bed to form a first enclosure that contains within at least one part of the remaining unfused powdered material in the first layer of the powder bed on the build platform, the first enclosure staying in direct contact with the remaining unfused powdered material; and
printing the object on the build platform using the powdered material contained by the first enclosure.

16. The system of claim 15, further comprising:
dispensing the powdered material to form a second layer of the powder bed on the first layer of the powder bed;
selectively fusing, based on the volume of the object, a portion of the powdered material of the second layer of the powder bed to form a second enclosure containing another portion of the remaining unfused powdered material of the second layer of the powder bed; and printing the object on the build platform using the powdered material contained by the first and second enclosures.

17. The system of claim 16, wherein the first enclosure comprises multiple powder containing walls surrounding a first area in the first layer of the powder bed of the build platform, wherein the second enclosure comprises multiple powder containing walls surrounding a second area in the second layer of the powder bed above the first layer of the powder bed, and wherein the second area is smaller than the first area.

18. The system of claim 15, wherein the first enclosure comprises at least one powder containing wall along at least a first perimeter of multiple perimeters of the build platform, and wherein a remaining second perimeter of the multiple perimeters of the build platform borders one or more structural walls that surrounds the first layer of the powder.

19. The system of claim 18, wherein the operations further comprise:

causing a relative movement between the build platform and the one or more structural walls in a direction perpendicular to the support surface of the build platform;

dispensing the powdered material on the first layer of the powder bed and the first enclosure to form a second layer of the powder bed; and selectively fusing a portion of the second layer of the powder bed to increase a height of the first enclosure.

20. The system of claim 1, wherein the operations further comprise:

selectively fusing, based on the volume of the object, a second portion of the powdered material of the first layer of the powder bed to form a second enclosure surrounding an area interior of the build platform to create a region devoid of the powdered material.

* * * * *